United States Patent [19]

Nitsche et al.

[11] 3,870,930

[45] Mar. 11, 1975

[54] IMPROVED SEMICONDUCTOR RECTIFIER ASSEMBLY HAVING A PIVOTABLE CONTROL MODULE

[75] Inventors: Herbert Nitsche, Spardorf; Johann Hufnagl, Erlangen, both of DT

[73] Assignee: Siemens Aktiengesellschaft, Munich, Germany

[22] Filed: Oct. 18, 1973

[21] Appl. No.: 407,454

[30] Foreign Application Priority Data

Oct. 30, 1972 Germany ................................ 39821

[52] U.S. Cl. .............. 317/100, 321/8 C, 317/234 A

[51] Int. Cl. ............................ H01l 1/06, H01l 1/12

[58] Field of Search .................... 165/100, 106, 107; 310/680; 321/8 C; 174/DIG. 5; 317/100, 234 A, 234 H

[56] References Cited

UNITED STATES PATENTS

| | | | |
|---|---|---|---|
| 3,253,646 | 5/1966 | Koltuniak | 317/100 |
| 3,435,891 | 4/1969 | Parrish | 317/100 |
| 3,447,118 | 5/1969 | Ferree | 317/234 A |
| 3,697,814 | 10/1972 | Christman | 317/100 |

*Primary Examiner*—Robert K. Schaefer
*Assistant Examiner*—Gerald P. Tolin
*Attorney, Agent, or Firm*—Kenyon & Kenyon Reilly Carr & Chapin

[57] ABSTRACT

An improved mounting for a semiconductor rectifier, its associated heat sink, control module and protective circuitry in which the rectifier is mounted so that wiring at both the front and rear of the assembly is possible with the heat sink used as a conductor for one terminal. The heat sink is mounted between insulating plates and has portions brought out through one or more cut-outs in the front and rear plates to conduct current there between and permit ease of making connections.

8 Claims, 4 Drawing Figures

IMPROVED SEMICONDUCTOR RECTIFIER ASSEMBLY HAVING A PIVOTABLE CONTROL MODULE

BACKGROUND OF THE INVENTION

This invention relates to semiconductor rectifiers in general and more particularly to an improved method of mounting such rectifiers which eases wiring and allows more compact arrangements of pluralities of such rectifiers.

Various mounting arrangements for semiconductor rectifiers have been developed and are commercially available. In some, heat sinks are arranged between front and rear insulating walls in such a manner that a flow of cooling medium through the heat sinks may be easily established. It is also fairly common practice to use the heat sink as a conductor for one of the terminals. Such an arrangement is shown for example, in German Offenlegungsschrift 1,439,269. Typically in these arrangements the path of current is only through a small part of the heat sink and the heat sink is not used in a manner which optimizes the wiring of different circuits with each other.

The type of rectifiers for which this invention is particularly applicable are usually high power devices and normally a plurality of such devices are used in combination such as in a bridge circuit. Thus, it is necessary to mount a plurality of such rectifiers in close proximity to each other so that they may be inter-wired. Conventionally, this has been done by mounting a plurality of rectifiers along with their heat sinks, protective circuitry and control modules in rows and columns within a cabinet. Typically, all wiring has been done on the front side of the assemblies. Normally, the control modules for several rectifiers are combined and mounted near the wall of the cabinet beside the assembly plates. In some installations, only a small amount of space is available for cabinet installation; thus, there is a need for compactness. Still, in spite of the requirement for compactness of the cabinets, it is necessary that the individual assemblies remain easily accessible.

Thus, there is a need for an arrangement which permits a compact installation in which a large plurality of semiconductor rectifiers can be mounted within a cabinet of small width while still permitting easy access to each of the individual assemblies.

SUMMARY OF THE INVENTION

The present invention solves this need by providing an assembly in which the heat sink is used as a conductor and has terminals extending through the insulating plates between which it is supported on both the front and rear sides. In the preferred embodiment, the control module is mounted to the front insulating plate, preferably in a hinged manner to allow ease of access to the protective circuitry above the heat sink. The use of the heat sink to conduct current to both the front and rear of the assembly permits wiring of the power leads, both in spaces in front of and behind the insulating plates leading to a more compact design and essentially allowing double the number of individual assemblies to be mounted in a given cabinet. With this arrangement, ease of access is not sacrificed with all individual assemblies still being accessible. In addition, the arrangement of the present invention gives added flexibility to the assembly allowing it to be used universally in different applications whereas previously different assemblies might have been required for different wiring arrangements. Because only a small wiring area is required on each side, the control modules can be mounted at the front insulating plate resulting in a space saving where several assemblies are combined so that a large plurality of the assemblies can be placed side-by-side in a row of the cabinet.

In the preferred embodiment, the heat sink has at least one connecting eye which, after mounting, protrudes through a cut-out in the front or rear insulating plate. This reduces the number of additional cables or conductors required when the assembly is used in various circuits. Also shown in the preferred embodiment, is a manner of assuring that the heat sink is properly centered between the insulating plates. For this purpose, at least one cut-out is provided in the insulating plate and at least one matching post is formed on the heat sink which will fit into the cut-out to properly center the heat sink. This design, insures each of assembly of the heat sinks and their associated semiconductors between the insulating plates. Adjustment processes which would otherwise be required and take up considerable amounts of time are eliminated. In addition, the cut-out and post arrangements serve to take up the torsional forces which are present when screwing the semiconductor into the heat sink.

Also shown is a connecting bar having connecting eyes on each end and running between the front and rear insulating plates and protruding from each. This arrangement permits connection of the cathode to the front eye and conduction by the connecting bar to behind the rear insulating plate so that cathode wiring may be accomplished at either the front or rear of the assembly. This, in turn, reduces cabling expenditures since the shortest cable run between assemblies can always be made.

DETAILED DESCRIPTION OF THE PREFERRED EMBODIMENT

Figure 2:
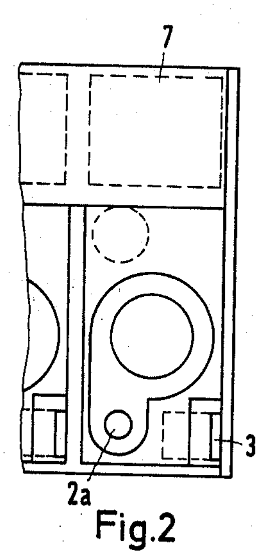
FIG. 2 is a front view of the assembly of FIG. 1.
Figure 1:
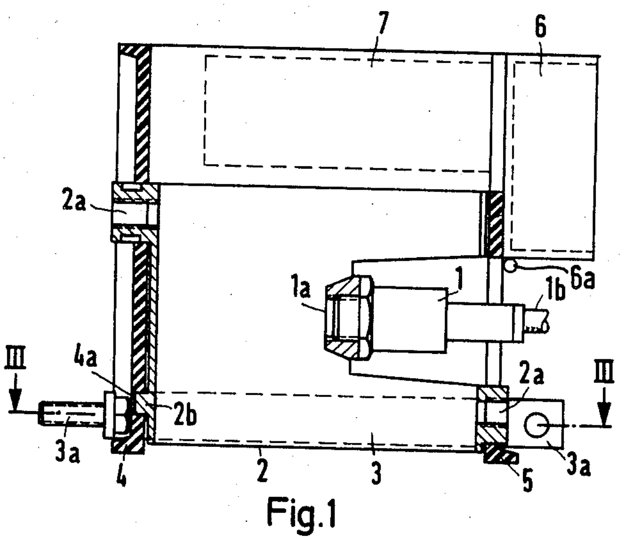
FIG. 1 is a cross-sectional view through an assembly according to the present invention.
Figure 3:
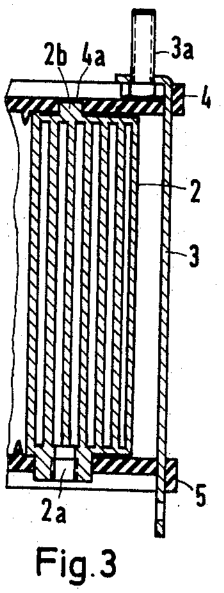
FIG. 3 is a section along the line III—III of FIG. 1.

The construction of the assembly of the present invention is illustrated by FIGS. 1, 2 and 3. A semiconductor rectifier 1 such as a thyristor is mounted to a heat sink 2. Heat sink 2 contains therein a threaded portion, into which the anode 1*a* of the thyristor 1 is tightly screwed. The cathode terminal of the thyristor is fitted with a connecting cable 1*b* which will have on its end a terminal in conventional fashion. The heat sink 2 is mounted between a front insulating plate 5 and a rear insulating plate 4. For ease of centering the heat sink between the insulating plates, the insulating plates are provided with one or more cut-outs 4*a* and the heat sink fitted with matching posts 2*b* which fit therein. In addition, cutouts are provided in the insulating plates 4 and 5 to permit the protrusion of connecting eyes 2a which are formed on either or both sides of the heat sink 2. This permits the anode current to be conducted from the anode terminal 1*a* of the thyristor to both the front and rear of the assembly. Associated with the thyristor and its heat sink is protective circuitry designated as 7 and a control module designated as 6. The protective circuitry is mounted above the heat sink as illustrated and the control module 6 mounted to the front insulating plate 5. Control module 6 is provided with a hinge 6*a* so that it can be swung down to provide access to the protective circuitry 7.

Since it is desirable to have not only anode connections available at both the front and the rear of the assembly but also cathode connections, a connecting bar 3 is provided which protrudes through appropriate openings in the insulating plates 4 and 5 at each end of the assembly. This connecting bar is provided with terminals 3*a* on each end to permit attachment of cabling. As is more clearly illustrated by FIG. 3, the connecting bar 3 is to one side of the heat sink 2 and mounted so that it is separated and insulated therefrom. Although the embodiment illustrated is shown as having the posts 2*b* which fit into associated cut-outs 4*a*, in some cases, where high positioning accuracy is not required in the insulation of the heat sink, the function of the post 2*b* can be performed by the connecting eyes 2*a* and their associated cut-outs.

Figure 4:
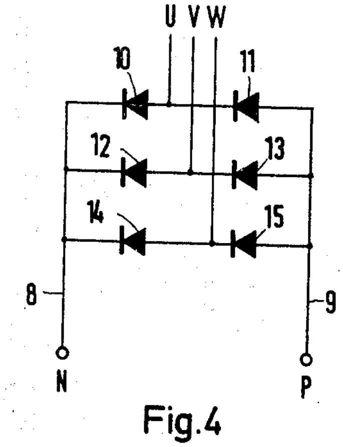
FIG. 4 is a schematic view of a typical bridge circuit in which the rectifier assemblies of the present invention are used.

FIG. 4 illustrates a three-phase bridge circuit, a typical application for semiconductor rectifiers of the type disclosed herein. To provide such an arrangement, six assemblies of the type disclosed above containing the respective rectifiers 10 through 15 will be installed side-by-side in a cabinet as illustrated by FIG. 2. At the rear of the cabinet, a DC bus bar 9 for the positive terminal P can be placed and attached to the rear anode terminals 2*a* of the assemblies containing the rectifiers 11, 13 and 15. A second DC bus bar 8 for the negative terminal N can be installed on the front side of the assemblies and coupled to the terminals 3*a* of the assemblies associated with the rectifiers 10, 12 and 14. These rectifiers will also have their cathode terminals 1*b* coupled to their appropriate terminals 3*a*. The cathode leads of the remaining three rectifiers, i.e., 11, 13 and 15 are connected to their respective current bars 3 at their terminals 3*a* to permit current conduction to the rear of the assembly. Here at the rear, the three phases U, V and W may then be connected to the appropriate terminals 3*a*. In addition, the three phases will also be connected to the remaining cathode terminals 2*a*. For example, phase U will be connected to the rear anode terminal 2*a* of the rectifier 10 and rear cathode 3*a* of the rectifier 11.

Thus, an improved mounting arrangement for rectifier assemblies which permits compactness and ease of wiring has been shown. Although a specific embodiment has been illustrated and described, it will be obvious to those skilled in the art that various modifications may be made without departing from the spirit of the invention which is intended to be limited solely by the appended claims.

What is claimed is:

1. In a semiconductor rectifier assembly, wherein a semiconductor rectifier is mounted in a heat sink which is arranged between front and rear insulating plates, there being installed along with the rectifier and heat sink protective circuitry and a control module, and wherein the anode and cathode terminals of the rectifier are led to the front of the assembly through cut-outs in the front insulating plate, an improved arrangement which permits greater compactness of installation and eases wiring comprising:

a. means coupling the anode of the rectifier to the heat sink;
b. a cut-out in the rear insulating plate;
c. a terminal electrically connected to said heat sink protruding through said cut-out in said rear insulating plate; and
d. a hinge mounting the control module on the front insulating plate so that said control module can be swung away from said plate.

2. The invention according to claim 1 wherein at least one of said anode terminals which are brought out through cut-outs in the front and rear insulating plates comprises a connecting eye protruding through said cut-out.

3. The invention according to claim 1 and further including at least one cut-out in one of said front and rear insulating plates and means on said heat sink to be inserted into said cut-out to aid in centering said heat sink.

4. The invention according to claim 2 and further including at least one cut-out in one of said front and rear insulating plates and means on said heat sink to be inserted into said cut-out to aid in centering said heat sink.

5. The invention according to claim 3 wherein said means to be inserted in said cut-out comprises a post formed on said heat sink.

6. The invention according to claim 4 wherein said means to be inserted in said cut-out comprises a post formed on said heat sink.

7. The invention according to claim 1 and further including a connecting bar running from the front to the rear of said assembly and having connecting terminals protruding through said front and rear insulating plates.

8. The invention according to claim 6 and further including a connecting bar extending from the front to rear of said assembly and having connecting terminals protruding through said front and rear insulating plates.

* * * * *

UNITED STATES PATENT OFFICE
CERTIFICATE OF CORRECTION

PATENT NO. : 3,870,930

DATED : March 11, 1975

INVENTOR(S) : Herbert Nitsche et al

It is certified that error appears in the above-identified patent and that said Letters Patent are hereby corrected as shown below:

In column 4, line 21 (claim 1 (d)), change "a hinge mounting" to --a hinge for mounting--

Signed and sealed this 29th day of April 1975.

(SEAL)
Attest:

RUTH C. MASON
Attesting Officer

C. MARSHALL DANN
Commissioner of Patents
and Trademarks